United States Patent
Shen et al.

(10) Patent No.: US 11,036,147 B2
(45) Date of Patent: Jun. 15, 2021

(54) SYSTEM AND METHOD FOR CONVERTING BACKSIDE SURFACE ROUGHNESS TO FRONTSIDE OVERLAY

(71) Applicant: KLA Corporation, Milpitas, CA (US)

(72) Inventors: Jian Shen, Shanghai (CN); Ningqi Zhu, Shanghai (CN); John McCormack, Linlithgow (GB); Yanfei Sun, Milpitas, CA (US)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 16/812,035

(22) Filed: Mar. 6, 2020

(65) Prior Publication Data

US 2020/0301291 A1 Sep. 24, 2020

Related U.S. Application Data

(60) Provisional application No. 62/821,105, filed on Mar. 20, 2019.

(51) Int. Cl.
*G03B 27/58* (2006.01)
*G03F 7/20* (2006.01)

(52) U.S. Cl.
CPC .............. *G03F 7/70708* (2013.01)

(58) Field of Classification Search
CPC .. G03F 7/70708; G03F 7/705; G03F 7/70633; G03F 7/70641; G03F 7/7065; G03F 7/70783; G03F 7/707; G03F 7/7075; H01L 21/6838; H01L 2924/3511; G01B 11/24; G06F 3/23
See application file for complete search history.

(56) References Cited

U.S. PATENT DOCUMENTS

| | | | |
|---|---|---|---|
| 2008/0018887 A1* | 1/2008 | Chen | G01N 21/956 356/237.2 |
| 2011/0172982 A1 | 7/2011 | Veeraraghavan et al. | |
| 2012/0092656 A1* | 4/2012 | Nakao | G01N 21/8851 356/237.3 |
| 2016/0305772 A1 | 10/2016 | Bow et al. | |
| 2018/0067403 A1 | 3/2018 | deVilliers | |

FOREIGN PATENT DOCUMENTS

| | | |
|---|---|---|
| KR | 20070114129 A | 11/2007 |
| KR | 20140124948 A | 10/2014 |

OTHER PUBLICATIONS

International Search Report and Written Opinion dated Jul. 10, 2020 for PCT/US2020/024040.

* cited by examiner

*Primary Examiner* — Peter B Kim
(74) *Attorney, Agent, or Firm* — Suiter Swantz pc llo

(57) ABSTRACT

A system for estimating front side overlay on a sample based on shape data is disclosed. The system includes a characterization sub-system and a controller. The controller includes one or more processors configured to: generate a vacuum hole map of a vacuum chuck; generate a vacuum force distribution across a sample based on the generated vacuum hole map of the vacuum chuck; determine shape data of the sample based on the vacuum force distribution and an identified relationship between backside surface roughness and vacuum force of the vacuum chuck; and convert the shape data of the sample to an overlay value of a frontside surface of the sample.

18 Claims, 6 Drawing Sheets

SYSTEM AND METHOD FOR CONVERTING BACKSIDE SURFACE ROUGHNESS TO FRONTSIDE OVERLAY

CROSS-REFERENCE TO RELATED APPLICATIONS

The present application claims the benefit under 35 U.S.C. § 119(e) of U.S. Provisional Application Ser. No. 62/821,105, filed Mar. 20, 2019, entitled METHOD TO CONVERT BACKSIDE HAZE TO FRONT SIDE OVERLAY IN ADVANCED NODE, naming Jian Shen, Ningqi Zhu, John McCormack, and Yanfei Sun as inventors, which is incorporated herein by reference in the entirety.

TECHNICAL FIELD

The present invention generally relates to the field of sample processing and, more particularly, to a system and method for converting surface roughness to overlay values.

BACKGROUND

Semiconductor devices typically include multiple patterned material layers in which each successive layer must be aligned to previous layers within tight tolerances. Accordingly, fabrication lines may utilize a process control system incorporating feedback and/or feedforward control data to monitor and adjust the settings of fabrication tools to maintain overlay errors (e.g., overlay registration errors between layers) within selected tolerances. As the dimensions of such semiconductor devices continues to decrease, so too do the acceptable tolerances for overlay errors. Overlay errors may result from various sources such as systematic bias from process tools (e.g., lithography tools), stochastic errors, sample geometry-induced errors (e.g., induced errors), or sample variations. Therefore, it would be desirable to provide a system and method for improving overlay measurement and control.

SUMMARY

A system is disclosed, in accordance with one or more embodiments of the present disclosure. In one embodiment, the system includes a characterization sub-system configured to measure backside surface roughness of a sample. In another embodiment, the system includes a process tool including a vacuum chuck. In another embodiment, the system includes a controller including one or more processors, the one or more processors configured to execute a set of program instructions stored in memory, the set of program instructions configured to cause the one or more processors to: generate a vacuum hole map of the vacuum chuck; generate a vacuum force distribution across the sample based on the generated vacuum hole map of the vacuum chuck; determine shape data of the sample based on the vacuum force distribution and an identified relationship between backside surface roughness and vacuum force of the vacuum chuck; and convert the shape data of the sample to an overlay value of a frontside surface of the sample.

A method is disclosed, in accordance with one or more embodiments of the present disclosure. In one embodiment, the method includes generating a vacuum hole map of the vacuum chuck. In another embodiment, the method includes generating a vacuum force distribution across the sample based on the generated vacuum hole map of the vacuum chuck. In another embodiment, the method includes determining shape data of the sample based on the vacuum force distribution and an identified relationship between backside surface roughness and vacuum force of a vacuum chuck of a process tool. In another embodiment, the method includes converting the shape data of the sample to an overlay value of a frontside surface of the sample.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which.

DETAILED DESCRIPTION

The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Reference will now be made in detail to the subject matter disclosed, which is illustrated in the accompanying drawings.

Referring generally to FIGS. 1A-5, a system and method for converting backside haze to frontside overlay is described, in accordance with one or more embodiments of the present disclosure.

Embodiments of the present disclosure are directed to a system and method for converting backside surface roughness, measured via haze data, to frontside overlay. Haze is a critical parameter that closely correlates to sample surface quality (e.g., surface roughness and nonuniformity in film layers). For example, haze may be used as a measure of surface roughness and detected as part of inspection. In this regard, haze can be used in a number of ways during the fabrication process. First, haze can be used to characterize semiconductor processes which alter the surface quality, such as polishing. Second, haze can be measured across the whole sample surface and can reveal changes in surface quality in various regions of a sample. Third, haze can have an important side effect on particle detection. For example, high levels of haze can produce high levels of noise and can make it difficult to detect defects on the surface of the sample. By way of another example, smoother surfaces have lower haze and therefore lower noise, and hence smaller defects can be detected. In this regard, the total amount of light scattered by a smoother surface is typically much lower than that scattered by a rougher surface.

Besides sample warpage, backside haze is a major overlay contributor in semiconductor devices. A strong correlation exists between haze intensity at a specific location on the sample and overlay values of the sample at that specific location on the sample. Specifically, there is a correlation between backside haze (e.g., surface roughness on the backside of the sample) and shape data of the sample. This shape data may be translated to overlay values on the frontside of the sample, such that backside haze may be converted to frontside overlay values.

Figure 1A:
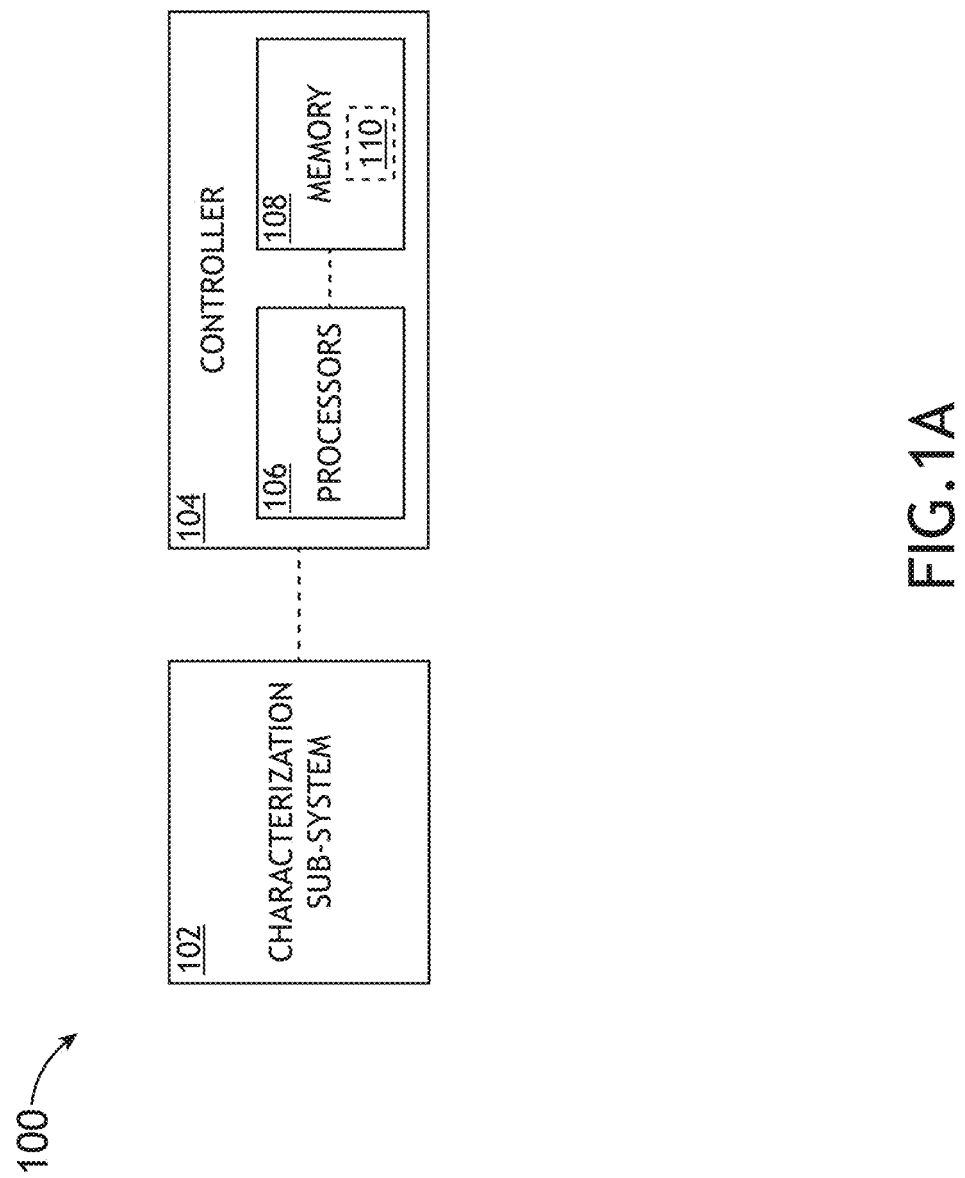
FIG. 1A illustrates a system for converting backside surface roughness to frontside overlay, in accordance with one or more embodiments of the present disclosure.

FIG. 1A illustrates a system 100 for converting backside haze to frontside overlay, in accordance with one or more embodiments of the present disclosure. In particular, FIG. 1A illustrates a system 100 for converting backside surface roughness to frontside overlay values. In one embodiment, the system 100 includes one or more characterization sub-systems 102. In another embodiment, the system 100 includes a controller 104 including one or more processors 106, a memory 108, and a set of program instructions 110.

It is noted herein that the characterization sub-system 102 may include, but is not limited to, inspection sub-system or a metrology sub-system. For the purposes of the present disclosure, it is noted herein that the characterization sub-system 102 may be referred to as a characterization tool. Likewise, a metrology sub-system may be referred to as a metrology tool, and an inspection sub-system may be referred to as an inspection tool. The characterization sub-system 102 may include any inspection sub-system 102 known in the art including, but not limited to, an optical-based inspection tool, a charged particle-based inspection tool, review tool, and the like. The characterization sub-system 102 may include any imaging-based metrology sub-system 102 known in the art including, but not limited to, an atomic force microscopy (AFM) tool or scanning electron microscopy (SEM) tool.

In one embodiment, the controller 104 is communicatively coupled to the one or more characterization sub-systems 102. In this regard, the one or more processors 106 of the controller 104 may be configured to generate one or more control signals configured to adjust one or more characteristics of the characterization sub-system 102 and may receive data (e.g., imagery data) from the characterization sub-system 102.

Figure 1B:
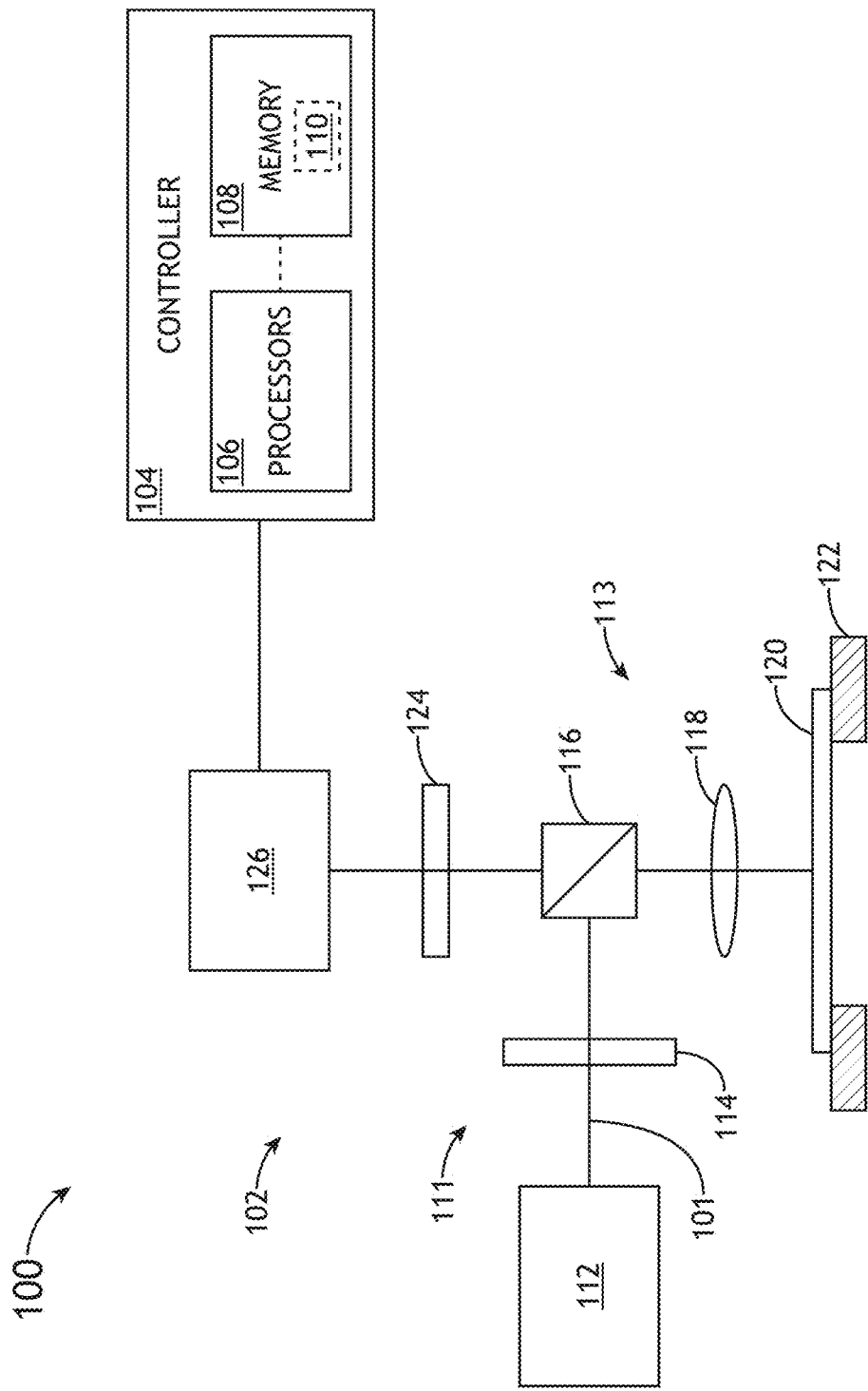
FIG. 1B illustrates the system for converting backside surface roughness to frontside overlay, in accordance with one or more embodiments of the present disclosure.

FIG. 1B illustrates a system 100 for converting backside haze to frontside overlay, in accordance with one or more embodiments of the present disclosure. In particular, FIG. 1B illustrates a system 100 including an optical characterization sub-system 102.

The characterization sub-system 102 may configured as an optical dark-field inspection tool. The optical characterization sub-system 102 may include, but is not limited to, an illumination source 112, an illumination arm 111, a collection arm 113, and a detector assembly 126.

In one embodiment, optical characterization sub-system 102 is configured to inspect and/or measure the sample 120 disposed on the stage assembly 122. For example, the optical characterization sub-system 102 may be configured to detect haze. For instance, the optical characterization sub-system 102 may be configured to detect haze on a backside surface of a sample 120. In another instance, the optical characterization sub-system 102 may be configured to detect haze on a frontside surface of a sample 120. Illumination source 112 may include any illumination source known in the art for generating illumination 101 including, but not limited to, a broadband radiation source. In another embodiment, optical characterization sub-system 102 may include an illumination arm 111 configured to direct illumination 101 to the sample 120. It is noted that illumination source 112 of optical characterization sub-system 102 may be configured in any orientation known in the art including, but not limited to, a dark-field orientation, a light-field orientation, and the like. For example, the one or more optical elements 114, 124 may be selectively adjusted in order to configure the characterization sub-system 102 in a dark-field orientation, a bright-field orientation, and the like.

Sample 120 may include any sample known in the art including, but not limited to, a semiconductor wafer, a reticle, a photomask, and the like. In one embodiment, sample 120 is disposed on a stage assembly 122 to facilitate movement of sample 120. In another embodiment, the stage assembly 122 is an actuatable stage. For example, the stage assembly 122 may include, but is not limited to, one or more translational stages suitable for selectively translating the sample 120 along one or more linear directions (e.g., x-direction, y-direction and/or z-direction). By way of another example, the stage assembly 122 may include, but is not limited to, one or more rotational stages suitable for selectively rotating the sample 120 along a rotational direction. By way of another example, the stage assembly 122 may include, but is not limited to, a rotational stage and a translational stage suitable for selectively translating the sample 120 along a linear direction and/or rotating the sample 120 along a rotational direction. It is noted herein that the system 100 may operate in any scanning mode known in the art.

The illumination arm 111 may include any number and type of optical components known in the art. In one embodiment, the illumination arm 111 includes one or more optical elements 114, a set of one or more optical elements, a beam splitter 116, and an objective lens 118. In this regard, illumination arm 111 may be configured to focus illumination 101 from the illumination source 112 onto the surface of the sample 120. The one or more optical elements 114 may include any optical elements known in the art including, but not limited to, one or more mirrors, one or more lenses, one or more polarizers, one or more beam splitters, wave plates, and the like.

In another embodiment, optical characterization sub-system 102 includes a collection arm 113 configured to collect illumination reflected or scattered from sample 120. In another embodiment, collection arm 113 may direct and/or focus the reflected and scattered light to one or more sensors of a detector assembly 126 via one or more optical elements 124. The one or more optical elements 124 may include any optical elements known in the art including, but not limited to, one or more mirrors, one or more lenses, one or more polarizers, one or more beam splitters, wave plates, and the like. It is noted that detector assembly 126 may include any sensor and detector assembly known in the art for detecting illumination reflected or scattered from the sample 120.

In another embodiment, the detector assembly 126 of the optical characterization sub-system 102 is configured to collect metrology data of the sample 120 based on illumination reflected or scattered from the sample 120. In another embodiment, the detector assembly 126 is configured to transmit collected/acquired images and/or metrology data to the controller 104.

As noted previously herein, the controller 104 of system 100 may include one or more processors 106 and memory 108. The memory 108 may include program instructions 110 configured to cause the one or more processors 106 to carry out various steps of the present disclosure. In one embodiment, the program instructions are configured to cause the one or more processors 106 to adjust one or more characteristics of the optical characterization sub-system 102 in order to perform one or more measurements of the sample 120.

In one embodiment, the one or more processors 106 of the controller 104 are configured to analyze the output of detector assembly 126. In one embodiment, the set of program instructions 110 are configured to cause the one or more processors 106 to analyze one or more characteristics of sample 120 based on images received from the detector assembly 126. In another embodiment, the set of program instructions 110 are configured to cause the one or more processors 106 to modify one or more characteristics of system 100 in order to maintain focus on the sample 120 and/or the detector assembly 126. For example, the one or more processors 106 may be configured to adjust one or more characteristics of the illumination source 112 and/or other elements of system 100 in order to focus the illumination 101 and/or one or more electron beams onto the surface of the specimen 120. By way of another example, the one or more processors 106 may be configured to adjust the one or more elements of system 100 in order to collect illumination and/or secondary electrons from the surface of the specimen 120 and focus the collected illumination on the detector assembly 126.

In another embodiment, the system 100 includes a user interface communicatively coupled to the controller 104. In another embodiment, the user interface includes a user input device and a display. The user input device of the user interface may be configured to receive one or more input commands from a user, the one or more input commands configured to input data into system 100 and/or adjust one or more characteristics of system 100. In another embodiment, the display of the user interface may be configured to display data of system 100 to a user.

In one embodiment, the one or more processors 106 may be communicatively coupled to memory 108, wherein the one or more processors 106 are configured to execute a set of program instructions stored on memory 108. The set of program instructions 110 are configured to cause the one or more processors 106 to carry out various functions and steps of the present disclosure. In one embodiment, the controller 104 is configured to identify a relationship between roughness on a backside surface of a sample and a vacuum force of a vacuum chuck. In another embodiment, the controller 104 is configured to generate a vacuum hole map of the vacuum chuck. In another embodiment, the controller 104 is configured to generate a vacuum force distribution across the sample based on the generated vacuum hole map of the vacuum chuck. In another embodiment, the controller 104 is configured to determine shape data of the sample based on the vacuum force distribution. In another embodiment, the controller 104 is configured to convert the shape data to an overlay value of a frontside surface of the sample. Each of these steps/functions of the controller 104 will each be described in further detail herein.

Figure 2B:
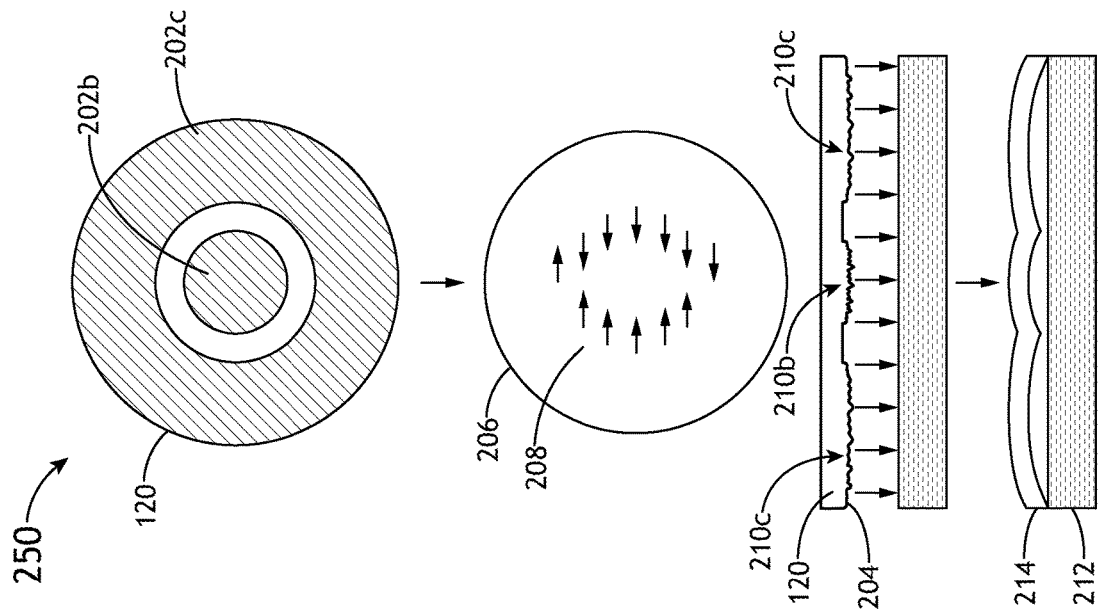
FIG. 2B illustrates a correlation between backside haze and frontside overlay, in accordance with one or more embodiments of the present disclosure.
Figure 2A:
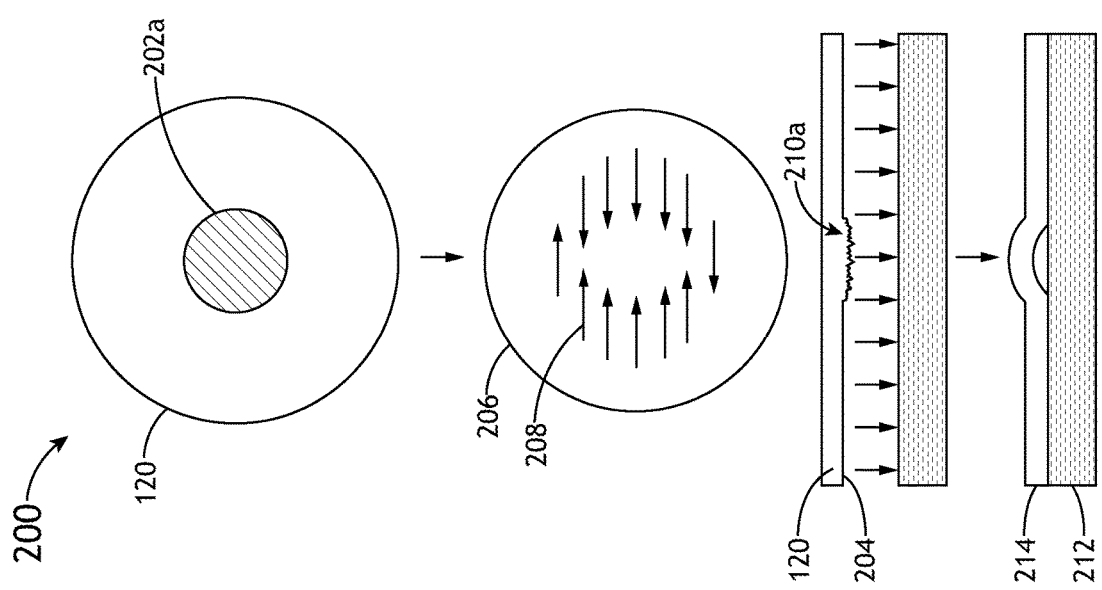
FIG. 2A illustrates a correlation between backside haze and frontside overlay, in accordance with one or more embodiments of the present disclosure.

FIG. 2A illustrates a correlation 200 between backside haze (or surface roughness) and frontside overlay, in accordance with one or more embodiments of the present disclosure. FIG. 2B illustrates a correlation 250 between backside haze (or surface roughness) and frontside overlay, in accordance with one or more embodiments of the present disclosure. It is noted herein that the correlations 200, 250 shown in FIGS. 2A-2B are merely illustrative and should not be construed as limiting the scope of the present disclosure.

In one embodiment, a sample 120 includes one or more areas of high haze 202. The one or more areas of high haze 202 may be acquired from a characterization sub-system (e.g., the characterization sub-system 102 shown in FIGS. 1A-1B). For example, the one or more areas of high haze 202 may be acquired from a characterization sub-system 102 configured to inspect a backside surface 204 of the sample 120. For instance, the one or more areas of high haze 202 may be acquired from a darkfield characterization sub-system configured to inspect the backside surface 204 of the sample 120.

In another embodiment, the one or more areas of high haze 202 on the backside surface 204 of the sample 120 correlate to frontside overlay signature 206. The frontside overlay signature 206 may include one or more frontside overlay values 208. In this regard, the presence of one or more high areas of haze 202 on the backside surface of the sample 120 may contribute to frontside overlay signature 206 in a similar location on the sample 120. It is noted herein that the overlay signature 206 and/or the frontside overlay values 208 shown in FIGS. 2A-2B are provided merely for illustrative purposes and shall not be construed as limiting the scope of the present disclosure.

As previously discussed herein, haze may be used as a measure of surface roughness. In another embodiment, the one or more areas of high haze 202 correspond to one or more areas of surface roughness 210 on a backside surface 204 of the sample 120. For example, as shown in FIG. 2A, a high haze area 202a corresponds to an area of surface roughness 210a on the backside surface 204 of the sample 120. By way of another example, as shown in FIG. 2B, a first high haze area 202b corresponds to a first area of surface roughness 210b and a second high haze area 202c corresponds to a second area of surface roughness 210c on the backside surface 204 of the sample 120. In this regard, as shown in FIG. 2B, the area of surface roughness 210b on the center of the backside surface 204 corresponds to the center circle of high haze 202b. Further, the area of surface roughness 210c on the outer perimeter of the backside surface 204 of the sample 120 corresponds to the outer circle of high haze 202c. It is noted herein that the diameters of the one or more areas of high haze 202 are provided merely for illustrative purposes and shall not be construed as limiting the scope of the present disclosure. For example, the one or more areas of surface roughness 210 and the corresponding one or more areas of high haze 202 may be any length and/or diameter known in the art.

In another embodiment, the one or more areas of surface roughness 210 on the backside 204 of the sample 120 are configured to convert to frontside sample shape data 214. For example, the sample 120 may be vacuum clamped to a vacuum chuck 212 configured to hold the sample 120 in place. For instance, the vacuum chuck 212 may apply a select force of vacuum pressure to hold the sample 120 during processing. In this regard, when the sample 120 is pulled flat by the vacuum chuck 212 the backside roughness 210 converts to frontside sample shape data 214, such that the frontside sample shape data contributes to overlay errors.

Figure 3:
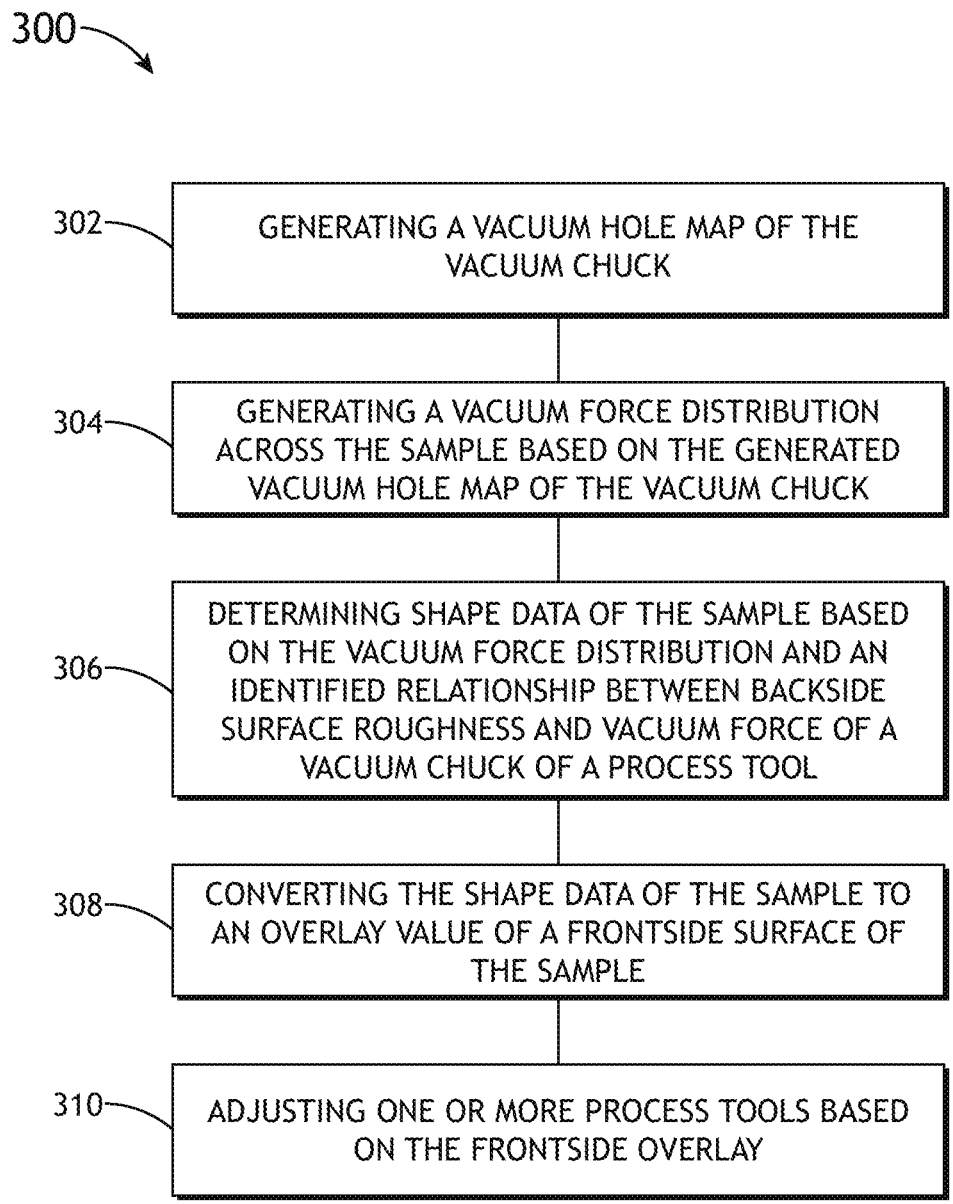
FIG. 3 illustrates a flowchart of a method for converting backside surface roughness to frontside overlay, in accordance with one or more embodiments of the present disclosure.

FIG. 3 illustrates a flowchart of a method 300 for converting backside haze to frontside overlay, in accordance with one or more embodiments of the present disclosure. It is noted herein that the steps of method 300 may be implemented all or in part by system 100. It is further recognized, however, that the method 300 is not limited to the system 100 in that additional or alternative system-level embodiments may carry out all or part of the steps of method 300.

Figure 4:
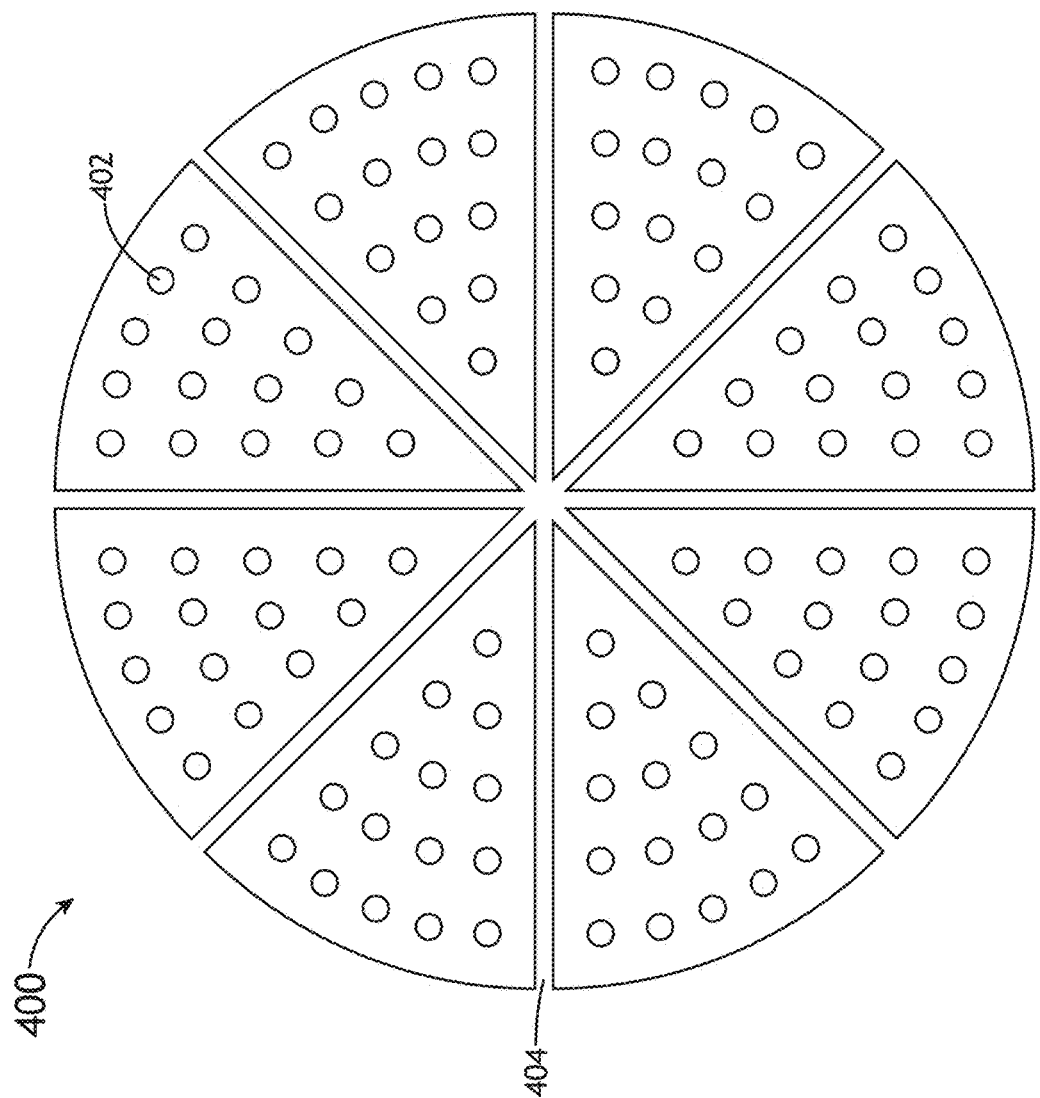
FIG. 4 illustrates a simplified view of a vacuum chuck hole map, in accordance with one or more embodiments of the present disclosure.

In a step 302, a vacuum hole map of the vacuum chuck may be generated. In another embodiment, the vacuum chuck is configured to vacuum clamp the sample 120 to the vacuum chuck. For example, the vacuum chuck may clamp the sample to the vacuum chuck such that the vacuum chuck ensures that the sample is positioned accurately in a process tool. It is noted herein that the system 100 may include any process tool known in the art including, but not limited to, a lithography tool, a deposition tool, an etch tool, or the like. FIG. 4 illustrates a simplified view of an exemplary vacuum hole map 400, in accordance with one or more embodiments of the present disclosure. In this example, the vacuum hole map 400 includes one or more vacuum holes 402 in a vacuum ring pattern. The one or more vacuum holes 402 may be configured to provide a threshold amount of vacuum force to hold the sample in place. The vacuum hole map 400 may further include one or more vacuum grooves 404. Although not shown, the vacuum hole map 400 may alternatively/additionally include one or more thermal rings configured to provide thermal heat configured to hold the sample in place. It is noted herein that the vacuum chuck may be formed of or plated with any material known in the art including, but not limited to, stainless steel, nickel, aluminum, gold, or the like. Further, it is noted herein that the vacuum chuck may be any size known in the art suitable for at least holding a portion of a sample in place (e.g., partial sample, whole sample, or the like).

In a step 304, a vacuum force distribution is generated across the sample based on the generated vacuum hole map of the vacuum chuck. In another embodiment, the vacuum force distribution is generated across the sample using a finite element analysis (FEA). For example, the FEA may be configured to simulate the real-word vacuum force of the vacuum chuck using a finite element method (FEM). It is noted herein that various scientific computing algorithms suitable for solving partial differential equations may be implemented to simulate the vacuum force distribution, such as, but not limited to, Rigorous Coupled Wave Analysis (RCWA), FEM, Finite-Difference Time-Domain (FDTD), boundary element method, Meshless CAD simulation, or the like, to solve the Electromagnetic (EM) problem induced by Maxwell's Equation, simulating synthetic signals for a given geometric model.

It is noted herein that the vacuum force distribution generated using FEA may include any vacuum force known in the art suitable for holding the sample in place. Further, it is noted herein that the vacuum force distribution may be adjusted based on the identified relationship between backside roughness and vacuum force of the chuck.

In a step 306, the vacuum force distribution and an identified relationship between backside surface roughness and vacuum force of the vacuum chuck are used to generate shape data of the sample.

In one embodiment, the identified relationship between backside surface roughness and vacuum force of the vacuum chuck is shown by f(haze)=F(vacuum)×$e^{-haze}$ (Eqn. 1), where the real vacuum force (f(haze)) is determined by the initial force of the chuck (F(vacuum)) and an exponential coefficient by haze ($e^{-haze}$). Once the real vacuum force (f(haze)) is identified using Eqn. 1, the real vacuum force may be used to generate shape data, which is discussed in greater detail herein.

In another embodiment, a characterization sub-system (e.g., the characterization sub-system 102 shown in FIGS. 1A-1B) detects haze on a sample 120 and sends the haze data to a controller 104 of system 100. For example, the detected haze from the one or more samples 120 may be used to determine the identified relationship between backside surface roughness and the vacuum force of the chuck (e.g., Eqn. 1). By way of another example, one or more sensors may be used to determine the identified relationship between backside surface roughness and the vacuum force of the chuck (e.g., Eqn. 1). For instance, one or more PMT sensors may be configured to measure haze on the sample 120. In this regard, the one or more PMT sensors may be configured to collect surface scattering signals from the sample 120. By way of another example, atomic force microscopy (AFM) may be configured to generate one or more surface roughness measurements (e.g., detect haze).

For example, the generated vacuum force distribution and the identified relationship between the backside surface roughness and vacuum force of the vacuum chuck may be used in a modeling computing program configured to generate shape data of the sample. It is noted herein that various modeling computing programs may be implemented to generate shape data of the sample, such as, but not limited to, FEA, RCWA, FEM, FDTD, boundary element method, Meshless CAD simulation, or the like.

In an optional step, although not shown, the modeling computing program may be further configured to use at least one of the vacuum force distribution, one or more target characteristics (e.g., shape, size, or the like), base shape formula, elemental relation, the identified relationship between backside surface roughness and vacuum force (e.g., Eqn. 1), or the like to generate shape data. The base shape formula may be given by $$E = \frac{FL}{S\Delta L}, \quad \text{(Eqn. 2)}$$

where E is Young's module, F is the vacuum force, L is the finite element, S is the cross-sectional area, and $\Delta L$ is the change in length of the finite element under the vacuum force. The modeling computing program (e.g., FEA) may utilize Eqn. 2 to determine to the shape of the sample 120 under a given vacuum force.

Figure 5:
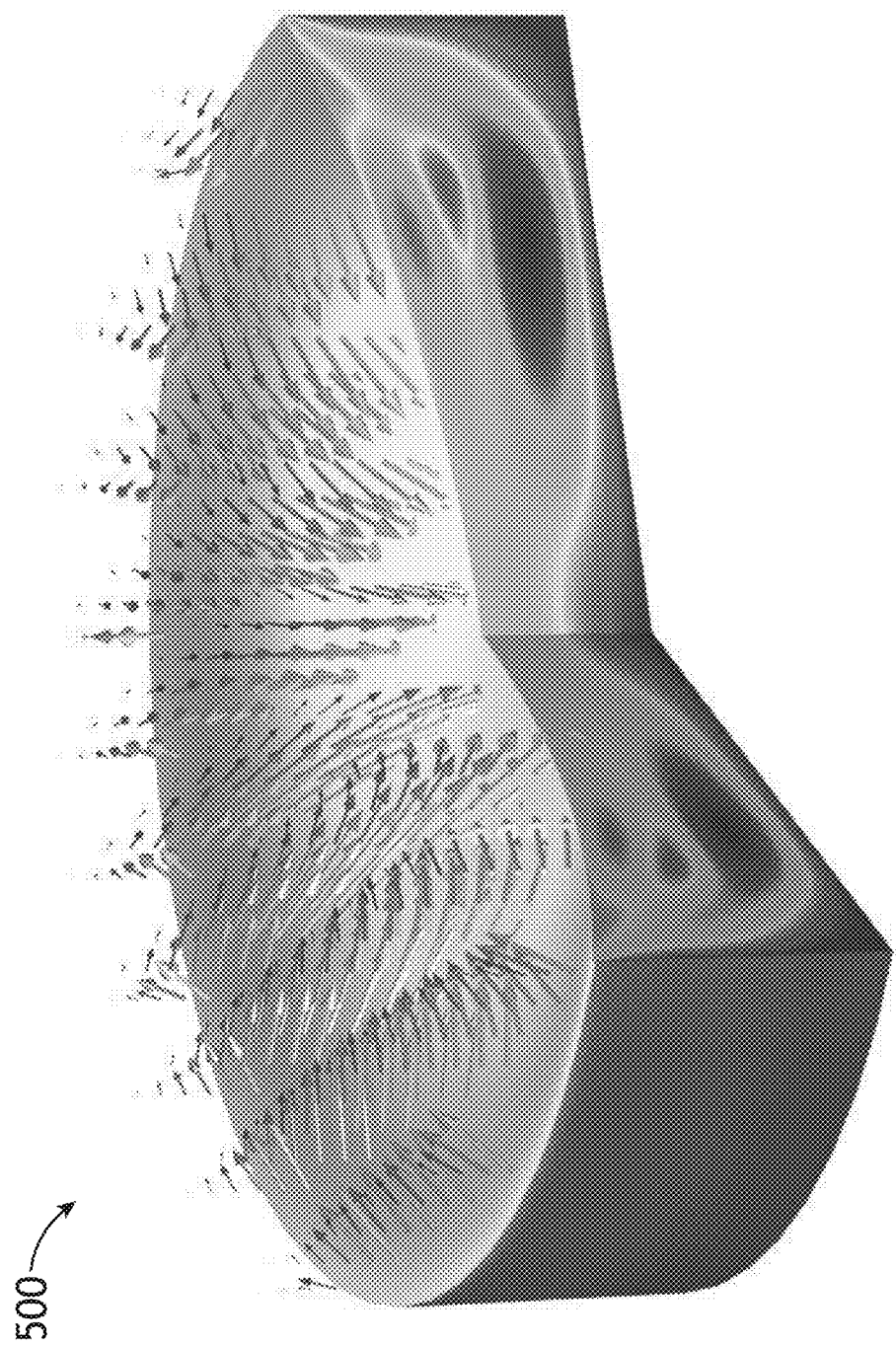
FIG. 5 illustrates a simplified view of shape data of a sample, in accordance with one or more embodiments of the present disclosure.

FIG. 5 illustrates shape data 500 generated based on the vacuum force distribution, in accordance with one or more embodiments of the present disclosure. In this example, the shape data 500 may include surface height data, surface thickness data, and the like.

In a step 308, the shape data of the sample may be converted to an overlay value of a frontside surface of the sample. For example, one or more models may be configured to convert the shape data to an overlay value of a frontside surface of the sample. For instance, the GEN4 model by KLA, Inc. and the 5D Analyzer by KLA, Inc. may be used to convert shape data to an overlay value of a frontside surface of the sample.

In a step 310, one or more process tools may be selectively adjusted based on the frontside overlay. In embodiments, the controller 104 may be configured to selectively adjust the one or more process tools based on the frontside overlay value. For example, the system 100 may further include one or more process tools. The process tools may include any process tools known in the art including, but not limited to, a lithography tool, an etching tool, a deposition tool, and the like. In this example, the controller 104 may be configured to generate one or more control signals configured to selectively adjust one or more characteristics of one or more process tools based on the frontside overlay. In this regard, the controller 104 may be configured to initiate feedforward and/or feedback control loops in order to selectively adjust various steps of a semiconductor device fabrication process.

One skilled in the art will recognize that the herein described components (e.g., operations), devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components (e.g., operations), devices, and objects should not be taken as limiting.

Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary.

The previous description is presented to enable one of ordinary skill in the art to make and use the invention as provided in the context of a particular application and its requirements. As used herein, directional terms such as "top," "bottom," "over," "under," "upper," "upward," "lower," "down," and "downward" are intended to provide relative positions for purposes of description, and are not intended to designate an absolute frame of reference. Various modifications to the described embodiments will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

All of the methods described herein may include storing results of one or more steps of the method embodiments in memory. The results may include any of the results described herein and may be stored in any manner known in the art. The memory may include any memory described herein or any other suitable storage medium known in the art. After the results have been stored, the results can be accessed in the memory and used by any of the method or system embodiments described herein, formatted for display to a user, used by another software module, method, or system, and the like. Furthermore, the results may be stored "permanently," "semi-permanently," temporarily," or for some period of time. For example, the memory may be random access memory (RAM), and the results may not necessarily persist indefinitely in the memory.

It is further contemplated that each of the embodiments of the method described above may include any other step(s) of any other method(s) described herein. In addition, each of the embodiments of the method described above may be performed by any of the systems described herein.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include but are not limited to physically mateable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A system, comprising:
a characterization sub-system configured to measure backside surface roughness of a sample, wherein the backside surface roughness is measured as haze;
a process tool including a vacuum chuck; and
a controller including one or more processors, the one or more processors configured to execute a set of program instructions stored in memory, the set of program instructions configured to cause the one or more processors to:
generate a vacuum hole map of the vacuum chuck;
generate a vacuum force distribution across the sample based on the generated vacuum hole map of the vacuum chuck;
determine shape data of the sample based on the vacuum force distribution and an identified relationship between backside haze and vacuum force of the vacuum chuck; and
convert the shape data of the sample to an overlay value of a frontside surface of the sample.

2. The system of claim 1, wherein the process tool comprises a lithography tool.

3. The system of claim 1, wherein the characterization sub-system comprises an inspection sub-system.

4. The system of claim 3, wherein the inspection sub-system comprises one or more photomultiplier tube (PMT) sensors.

5. The system of claim 1, wherein the characterization sub-system comprises a metrology sub-system.

6. The system of claim 5, wherein the metrology sub-system comprises an atomic force microscopy (AFM) tool.

7. The system of claim 1, wherein a modelling program is configured to generate the vacuum force distribution across the sample based on the generated vacuum hole map of the vacuum chuck.

8. The system of claim 7, wherein the modelling program comprises a finite element analysis (FEA) program.

9. The system of claim 1, wherein one or more models are configured to convert the shape data of the sample to the overlay value of the frontside of the sample.

10. The system of claim 1, wherein the controller is further configured to:
generate one or more control signals configured to selectively adjust one or more characteristics of one or more process tools based on the overlay value of the frontside surface of the sample.

11. A system, comprising:
a controller including one or more processors, the one or more processors configured to execute a set of program instructions stored in memory, the set of program instructions configured to cause the one or more processors to:
generate a vacuum hole map of a vacuum chuck of a process tool;
generate a vacuum force distribution across a sample based on the generated vacuum hole map of the vacuum chuck;
determine shape data of the sample based on the vacuum force distribution and an identified relationship between backside haze and vacuum force of the vacuum chuck; and
convert the shape data of the sample to an overlay value of a frontside surface of the sample.

12. The system of claim 11, wherein the characterization sub-system comprises at least one of an inspection sub-system or a metrology sub-system.

13. A method, comprising:
generating a vacuum hole map of a vacuum chuck;
generating a vacuum force distribution across a sample based on the generated vacuum hole map of the vacuum chuck;
determining shape data of the sample based on the vacuum force distribution and an identified relationship between backside haze and vacuum force of the vacuum chuck of a process tool; and
converting the shape data of the sample to an overlay value of a frontside surface of the sample.

14. The method of claim 13, wherein the process tool comprises a lithography tool.

15. The method of claim 13, wherein a modelling program is configured to generate the vacuum force distribution across the sample based on the generated vacuum hole map of the vacuum chuck.

16. The method of claim 15, wherein the modelling program comprises a finite element analysis (FEA) program.

17. The method of claim 13, wherein one or more models are configured to convert the shape data of the sample to the overlay value of the frontside of the sample.

18. The method of claim 13, further comprising:
generating one or more control signals configured to selectively adjust one or more characteristics of one or more process tools based on the overlay value of the frontside surface of the sample.

* * * * *